United States Patent
Bhaskaran et al.

(10) Patent No.: US 8,555,134 B2
(45) Date of Patent: *Oct. 8, 2013

(54) TURBO CODING FOR UPSTREAM AND DOWNSTREAM TRANSMISSION OVER A CHANNEL

(75) Inventors: Ravi Bhaskaran, Indiranagar (IN); Bruce J. Currivan, Los Altos, CA (US); Thomas J. Kolze, Phoenix, AZ (US); Ba-Zhong Shen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/613,328

(22) Filed: Sep. 13, 2012

(65) Prior Publication Data

US 2013/0064323 A1     Mar. 14, 2013

Related U.S. Application Data

(63) Continuation of application No. 12/843,558, filed on Jul. 26, 2010, now Pat. No. 8,301,967, which is a continuation of application No. 10/388,473, filed on Mar. 17, 2003, now Pat. No. 7,765,577.

(60) Provisional application No. 60/436,470, filed on Dec. 27, 2002.

(51) Int. Cl.
*G06F 11/00* (2006.01)

(52) U.S. Cl.
USPC .......................................... 714/755; 714/752

(58) Field of Classification Search
USPC ......... 714/755, 756, 759, 784, 786; 725/131, 725/139, 144, 151
See application file for complete search history.

(56) References Cited

U.S. PATENT DOCUMENTS

| | | | |
|---|---|---|---|
| 5,406,570 A | 4/1995 | Berrou et al. | |
| 5,446,747 A | 8/1995 | Berrou | |
| 5,563,897 A | 10/1996 | Pyndiah et al. | |
| 6,065,147 A | 5/2000 | Pyndiah et al. | |
| 6,119,264 A | 9/2000 | Berrou et al. | |
| 6,122,763 A | 9/2000 | Pyndiah et al. | |
| 6,266,795 B1* | 7/2001 | Wei | 714/755 |
| 6,782,497 B2 | 8/2004 | Yue | |

(Continued)

FOREIGN PATENT DOCUMENTS

| | | |
|---|---|---|
| EP | 0 735 696 A2 | 10/1996 |
| FR | 2 675 970 A1 | 4/1991 |

OTHER PUBLICATIONS

Minassian, G., "*Home Phone Line Networks: The Next Networking Challenge*," Electronic Product Design, IML Publication, GB, vol. 19, No. 11, dated, Nov. 1998, pp. C15-C21.

(Continued)

*Primary Examiner* — Dieu-Minh Le
(74) *Attorney, Agent, or Firm* — Sterne, Kessler, Goldstein & Fox P.L.L.C.

(57) ABSTRACT

A method of transmitting data in a cable modem system includes the steps of encoding the data using forward error correction. The data is then encoded with Turbo encoding. The data is then sent to a modulation scheme. The data is then transmitted over a cable channel. The data is then demodulated. The data is then decoded using a Turbo decoder. An inverse of the forward error correction is then applied to the data.

20 Claims, 12 Drawing Sheets

(56) References Cited

U.S. PATENT DOCUMENTS

| | | | |
|---|---|---|---|
| 6,842,491 B2 | 1/2005 | Gelblum et al. | |
| 2002/0154704 A1* | 10/2002 | Reshef | 375/262 |
| 2010/0278098 A1 | 11/2010 | Lin et al. | |

OTHER PUBLICATIONS

International Search Report issued Feb. 25, 2003 for Appl. No. PCT/US01/28323, 12 pages.

Research and Development: Communications/Turbo Coding, from http://www.xenotran.com/turbo_tech_error_turbo.html, 5 pages (last visited Mar. 11, 2002).

Ryan, W.E., "*A Turbo Code Tutorial*,"Proc. IEEE Globecom '98, IEEE, 7 pages (1998).

Seo, G. et al., "*An implementation of VoIP Cable Modem*," IEEE TENCON, IEEE 1532-1535 (Sep. 1999).

Telecommunications and Mission Operations Directorate—DSN Technology Program, from http://www331.jpl.nasa.gov/public/TurboForce.GIF, 1 page (last visited Mar. 11, 2002).

Valenti, M.C., "*Turbo codes and Iterative Processing*," IEEE New Zealand Wireless Communications Symposium, IEEE 42 pages including tutorial slides (Nov. 1998).

* cited by examiner

TURBO CODING FOR UPSTREAM AND DOWNSTREAM TRANSMISSION OVER A CHANNEL

CROSS-REFERENCE TO RELATED APPLICATIONS

This application is related to commonly assigned application Ser. No. 10/208,045 (now U.S. Pat. No. 7,694,210), filed on Jul. 31, 2002, entitled TURBO-CODING DOCSIS INFORMATION FOR SATELLITE COMMUNICATION, which is incorporated by reference herein; and this application is a continuation of U.S. patent application Ser. No. 12/843,558 (now U.S. Pat. No. 8,301,967), Jul. 26, 2010 which is a continuation of U.S. patent application Ser. No. 10/388,473 (now U.S. Pat. No. 7,765,577), filed Mar. 17, 2003, which claims benefit of U.S. Provisional Patent Application No. 60/436,470, filed on Dec. 27, 2002, all of which are incorporated herein by reference in their entirety.

BACKGROUND OF THE INVENTION

1. Field of the Invention

The present invention relates to encoding of data transmissions and cable modem systems.

2. Background Art

Forward error correction (FEC) is required in cable modem systems to provide high quality communication over the RF propagation channel, which induces signal waveform and spectrum distortions. These impairments drive the design of the transmission and receiver equipment, the design objective which is to select modulation formats, error control schemes, demodulation and decoding techniques and hardware components that together provide an efficient balance between system performance and implementation complexity.

Traditional forward error correction (FEC) schemes for communication systems include use of convolutional codes, block codes such as Reed-Solomon or BCH codes, and/or concatenated coding schemes. Turbo Codes are a relatively new class of codes that have been demonstrated to yield bit error rate (BER) performance close to theoretical limits on important classes of channels by means of an iterative soft-decision decoding method. A Turbo encoder consists of a parallel or serial concatenation of typically two systematic, recursive convolutional codes ("constituent codes") separated by an interleaver that randomizes the order of presentation of information bits to a second constituent encoder with respect to a first constituent encoder. The performance of a Turbo Code depends on the choice of constituent codes, interleaver block size (which generally increases with higher block length), and number of decoder iterations. For a particular Turbo Code, in which the constituent codes are fixed, one can ideally adjust the block size and number of decoder iterations to trade-off performance, latency, and implementation complexity requirements. As the block size changes, however, a new interleaver matched to that block size is required.

Accordingly, there is a continued need for coding schemes that provide higher performance under noise conditions prevailing in cable modem systems.

BRIEF DESCRIPTION OF THE FIGURES

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Reference will now be made in detail to the preferred embodiments of the present invention, examples of which are illustrated in the accompanying drawings.

Figure 1:
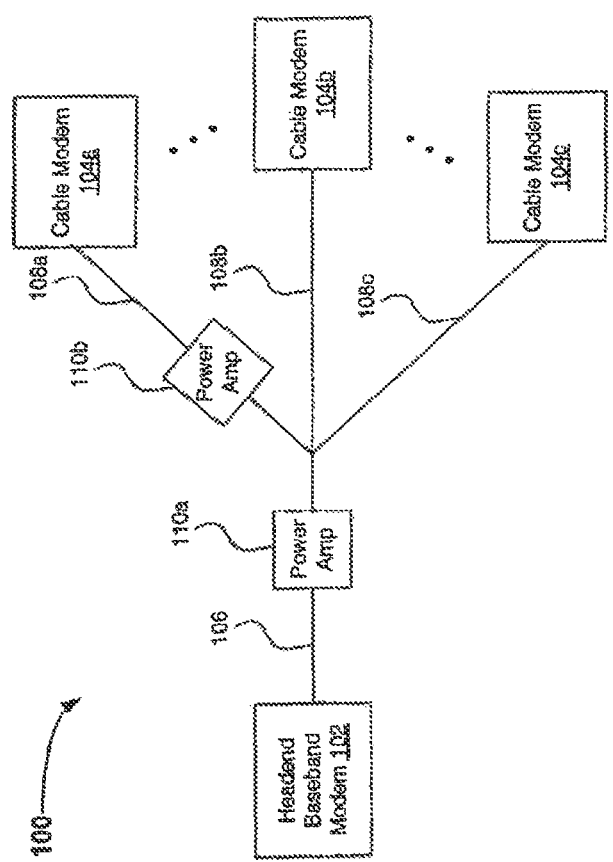
FIG. 1 illustrates a cable modem transmitter and receiver system.

FIG. 1 is a block diagram of a cable modem communication system 100, including a headend baseband modulator/demodulator ("headend") 102 that communicates with a plurality of cable modulators/demodulators ("modems") 104 through a primary cable 106, which branches to user cables 108. The cable modems 104 demodulate data from the headend 102, and modulate data to be transmitted to the headend 102. One or more optional intermediate power amplifiers 110 can be placed along the cables 106 and/or 108 to boost signal strength. The cables 106 and 108 have less impairments compared to wireless communication systems. The relatively low noise, the optional intermediate power amplifiers 110, and relatively short distances involved, provide the cable modem communication system 100 with a relatively high signal-to-noise ratio ("SNR").

The communication paths from the headend 102 to the users 104 are called down-stream paths or channels. The communication paths from the users 104 to the headend are called up-stream paths or channels. The protocol commonly used to send data upstream and downstream is known as DOCSIS, although the invention is not limited to any particular protocol.

In conventional DOCSIS systems, upstream channels are time division multiple access ("TDMA") channels, where multiple cable modems share an upstream channel. The headend assigns bandwidth to the cable modems by means of time-slot mapping ("MAP") messages that are broadcast to users of a given upstream channel. The MAP messages contain information allowing each user to burst an appropriate type of data on the upstream channel at an appropriate time. In conventional DOCSIS systems, the upstream data bursts are typically encoded with Reed Solomon (RS) forward error correction ("FEC"), to increase the reliability of the data reception at the headend. In conventional DOCSIS systems, upstream signals to the headend are transmitted at relatively low frequencies (e.g., in the range of 5-65 MHz).

The flexibility and high performance of Turbo Codes make them a potentially attractive technology for sophisticated data communications services, such as cable modem communications systems, though they have never been applied to cable modem systems before for a number of reasons.

Figure 2:
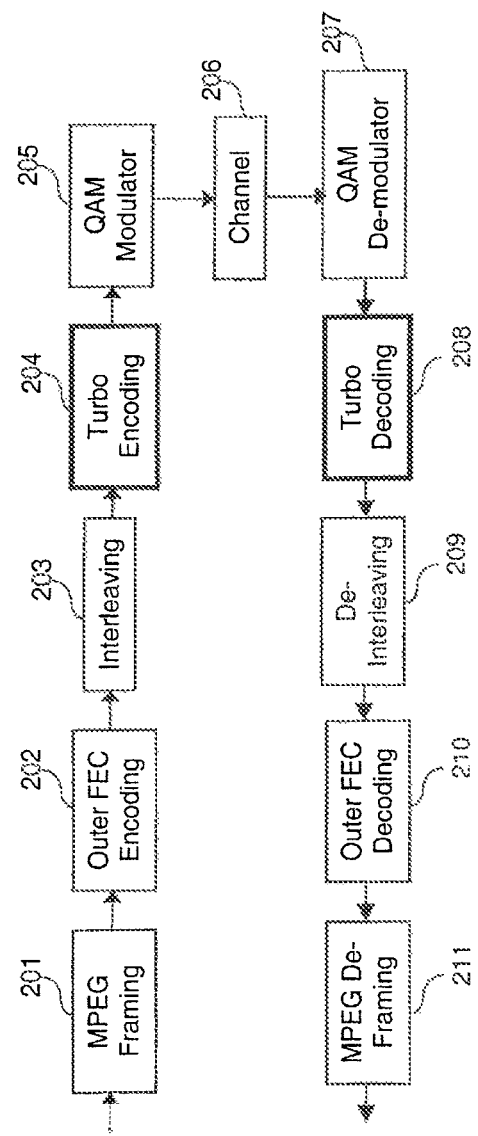
FIG. 2 illustrates a Turbo Encoder and Decoder used in the cable modem system of FIG. 1.

FIG. 2 illustrates the cable modem transmitter and receiver system of the present invention. As shown in FIG. 2, input data is fed into an MPEG framer 201 (e.g., for MPEG 2 or MPEG 4 framing). After the MPEG framer 201, the MPEG frames go into an outer FEC (Forward Error Correction) encoder 202. Generally, the FEC encoder 202 may be either a block type or a trellis type (sometimes known as convolution type. Block type encoders are well known in the art, and include, e.g., Reed Solomon, Reed-Muller, Hamming, and a number of others.

Further with reference to FIG. 2, the data from the outer FEC encoder 202 goes into an interleaver 203, whose primary purpose is to spread the data out temporally to reduce the effect of errors at the decoder. These errors are due to impulse noise or bursts of errors produced by a Viterbi decoder.

From the interleaver 203, the signal enters a Turbo Encoder 204, which will be described in further detail below. It then enters a modulator 205. The modulator 205, e.g., may be a QAM modulator (e.g., a 16 QAM modulator, a 64 QAM modulator, 256 QAM or 1024 QAM modulator), or it may be a QPSK modulator.

The modulator 205 outputs the signal onto the channel 108, which may, for example, be a coaxial cable or a fiber optic cable.

On the receiver end, the signal is received by a demodulator 207, and is inputted into a Turbo Decoder 208, which will be discussed in additional detail below. A deinterleaver 209 reverses the interleaving operation of the interleaver 203, and an outer FEC decoder applies the appropriate error correction, scheme matching the FEC encoder 202. An MPEG deframer 211 (e.g., for MPEG 2 or MPEG 4 deframing) then outputs data out to the rest of the receiver system.

Error correcting (FEC) codes are normally classified according to whether they employ memory in the encoding process. This classification process results in codes being classified as either convolutional codes or block codes. The present invention is applicable to both block codes and trellis codes.

Block codes (e.g., RS, RM, Hamming) transform a block of k bits into an n-bit codeword by adding n–k redundant bits that are algebraically related to the k message bits. The channel encoder for an (n,k) linear block code generates bits at the rate: $R_0 = (n/k) \cdot R_s$ where $R_s$ is the information rate of the source r=k/n is known as the code rate, and $R_o$ is the channel data rate.

Block codes in which the message bits are transmitted unaltered are known as systematic codes. A systematic structure divides the codeword into two parts, the k message bits and the (n–k) parity bits. The (n–k) parity bits are linear sums of the k message bits, where each of the (n–k) equations are linearly independent (that is, no equation in the set can be expressed as a linear combination of the remaining equations).

As an example, for MPEG 2 frame format, the Reed-Solomon code becomes a (188, 204) code, i.e., the frames includes 16 parity bytes and 188 data bytes. FEC overhead tends to be higher for trellis codes than for block codes such as Reed-Solomon. Note farther that block codes such as Reed-Solomon, error connection is done in a single pass.

The convolutional encoding process (trellis encoding) is a discrete-time convolution of the input sequence with the impulse response of the encoder. A convolutional encoder operates on the incoming message sequence continuously in a serial manner, and can be modeled as a finite-state machine consisting of an M-stage shift register. An L-bit message sequence produces a coded output sequence of length of n(L+M) bits. The code rate is given by $$r = \frac{L}{n(L+M)} \approx \frac{1}{n}$$

bits/symbol.

Figure 3:
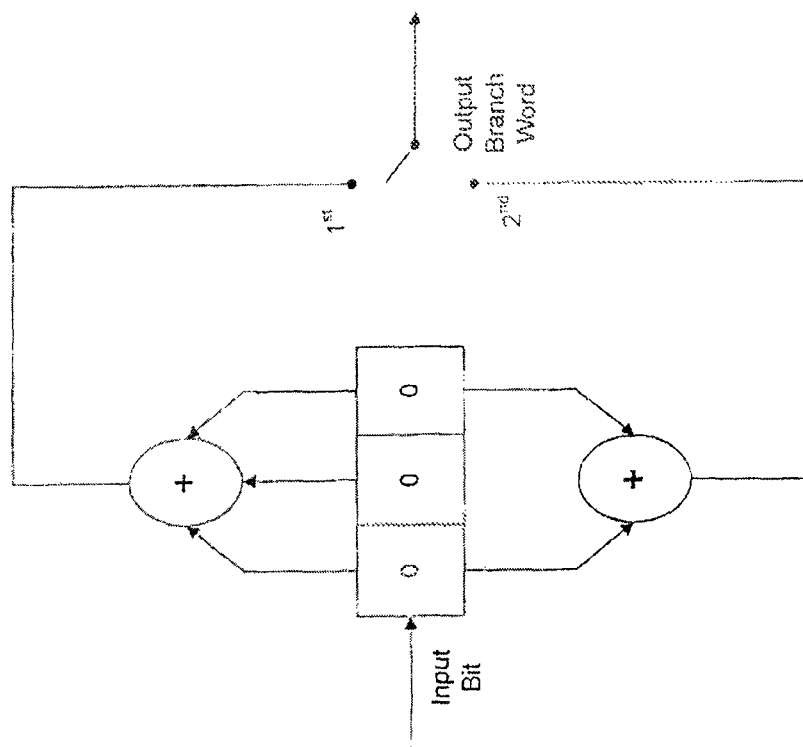
FIG. 3 shows an example of a convolutional encoder.

FIG. 3 shows an example of a (2, 1) convolutional encoder, with constraint length M=3. In theory, as convolution codes are not block codes, this encoder should have a code rate of ½. However, convolutional encoders are often forced into a block structure, due to periodic truncation. This occurs as the convolutional encoder flushes the remaining bit out of the register by appending zeros. In this example, 3 zeros would be appended, which brings the effective code rate down. However, as the number of bits before the periodic truncation increases, the code rate approaches ½.

The two generators for this code are $G_1=7_O$ (octal) and $G_2=5_O$ (octal). With an input sequence 101, the following output sequence results: 11 10 00 10 11. These are pairs of outputs from $G_1$ and $G_2$ respectively. In this example, two extra zeros have been inputted, to flush the register, and ensure a full code. In the case shown above, the two 6-bit codewords are 11 10 11 for an input bit 1, and 00 00 00 for an input bit 0. To encode an input of 101, the output becomes 11 (10+00) (11+00+11) (00+10) 11, which gives the same result as above, 11 10 00 10 11.

A convolution code (i.e., trellis code) may be decoded by applying the principle of maximum likelihood decoding to minimum distance decoding by choosing a path in a code tree whose coded sequence differs from the received sequence in the fewest number of places.

Turbo encoders are generally described in Valenti, Matthew C., "Turbo Codes and Iterative Processing," Mobile and Portable Radio Research Group, Virginia Polytechnic Institute and State University, Blacksburg, Va.; "Research and Development: Communications/Turbo Coding," Xenotran, http://xenotran.com/turbo_tech_error_turbo.html, Mar. 11, 2002; W. E. Ryan, "A Turbo Code Tutorial," Proc. IEEE Globecom'98, 1998; "Telecommunications and Mission Operations Directorate—DSN Technology Program: Communications Systems Analysis: Turbo Codes," http://www331.jpl.nasa.gov/public/TurboForce.GIF, Mar. 3, 2002; and Luke Hebbes and Ron Malyan, "Comparative Performance Modelling of Turbo, Block and Convolutional Coding over very noisy channels," (http://technology.kingston.ac.uk/ncg/Research/Publications/1998/Comp_Mod el_IC/Comp_Model_TC.htm), all of which are hereby incorporated by reference in their entireties.

Turbo encoders typically use at least two convolutional component encoders. Turbo encoders can also be based on block encoding techniques, such as Reed Solomon, Reed Muller, or Hamming codes. Turbo codes include, for example, and without limitation, Parallel Concatenated Convolutional Codes (PCCC), Serial Concatenated Convolutional Codes (SCCC), and Hybrid Concatenated Convolutional Codes (HCCC).

Turbo codes are parallel or serial concatenated, Recursive Systematic Convolutional (RSC) codes. RSC codes can perform better than the best Non-Systematic Convolutional (NSC) codes at any Signal-to-Noise Ratio (SNR). Turbo codes, therefore, can provide significant performance improvements over more conventional coding schemes.

An RSC code is obtained by employing a feedback loop in a NSC code, and setting one of the outputs to be the input bit sequence. This can be more easily seen in FIGS. 4 and 5, described below, which show alternative embodiments for producing an NSC code (FIG. 4) or an RSC code (FIG. 5). The example used here shows encoders with memory M=4, with generators G1=37$_O$ and G2=21$_O$.

Figure 4:
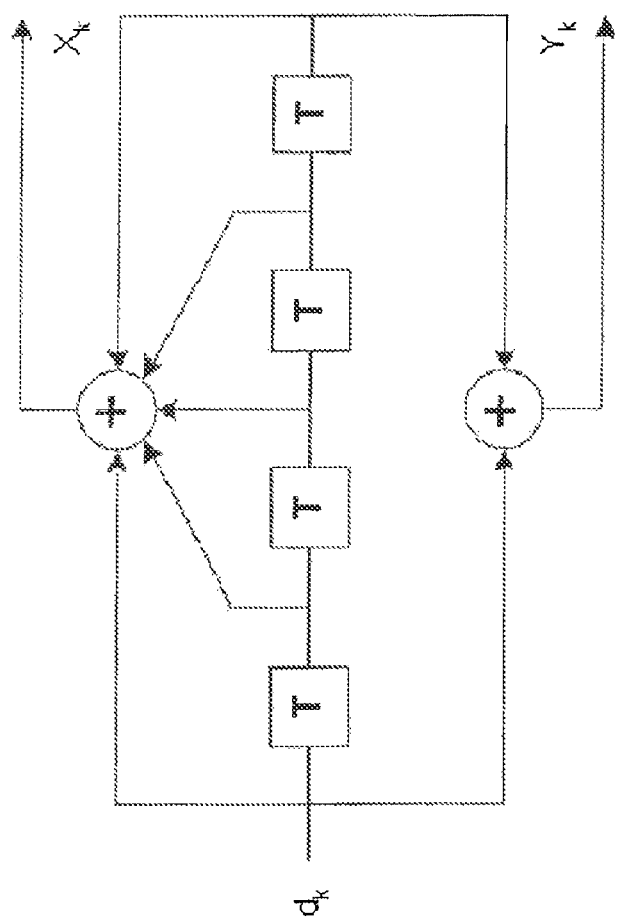
FIGS. 4 and 5 show examples of convolutional encoders for producing Turbo convolutional codes.
Figure 5:
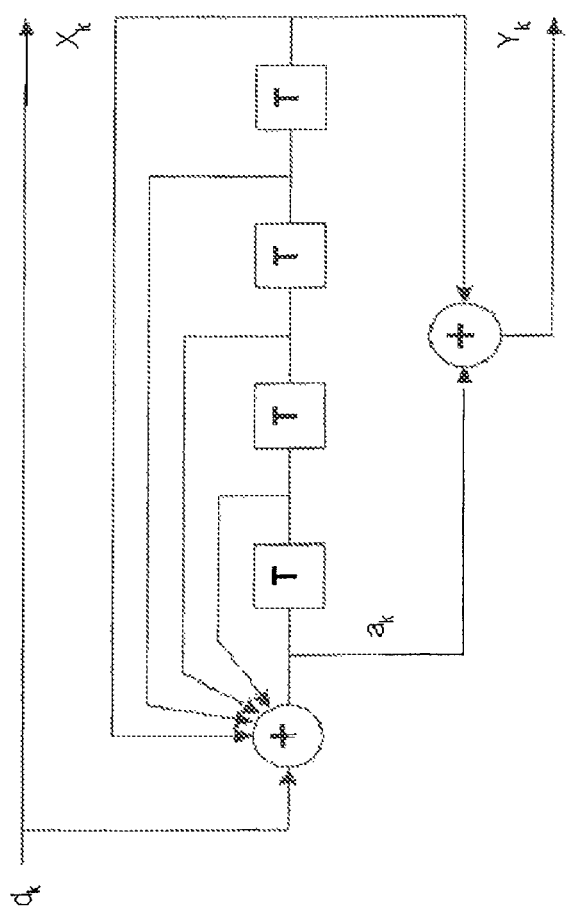

The memory is provided by the four delay blocks T shown in FIG. 4. For instance, if the initial state of the memories were to be 0000, in the example above, then an input sequence of 1001 would produce the following memory states after each bit has been presented: 1000, 1100, 0110, 1011. The combination of these memories is then taken according to the generator. In the above case, the two generators are 37$_O$ and 21$_O$. It can be seen from the figure that the two generators can be represented in binary by 11111$_b$ and 10001$_b$ respectively, or 31$_d$ and 17$_d$ respectively, in decimal. They are, however, usually quoted in octal.

Figure 6:
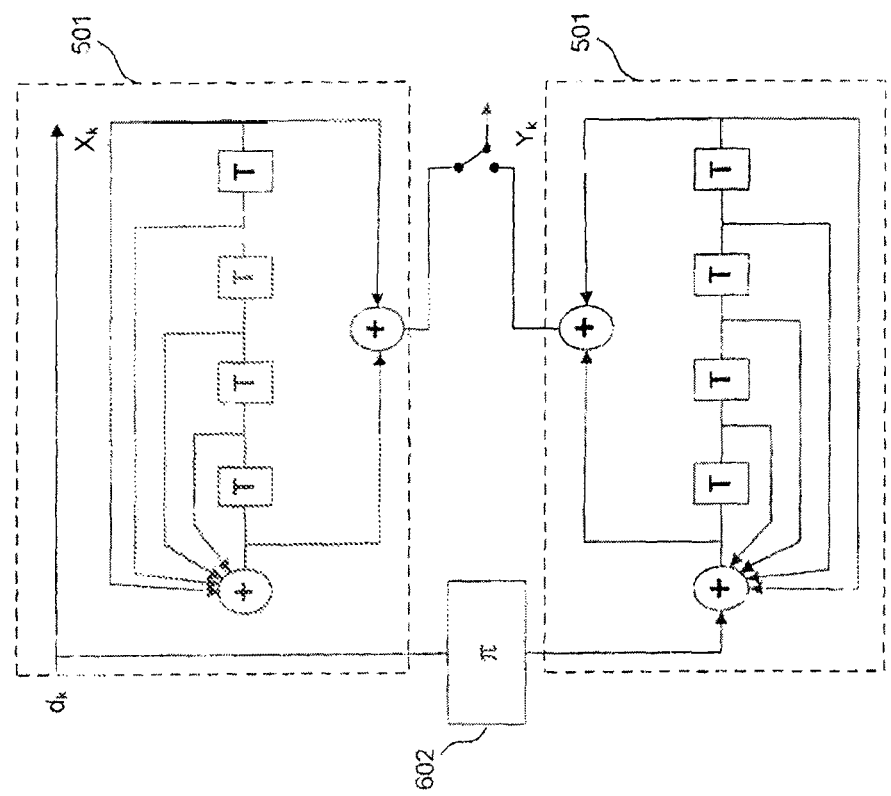
FIG. 6 shows a concatenation of outputs of two convolutional codes in a Turbo encoder.

In the Turbo code, two identical RSC codes are combined in parallel or serially. A parallel concatenation of the two constituent codes can be seen in FIG. 6. FIG. 6 shows two (37, 21) RSC codes with memory M=4. It can be seen from FIG. 6 that two outputs are taken: one is the actual input bit, and the other is either a bit from one RSC encoder or the other.

The Turbo encoder 208 includes an interleaver 602 (interleavers are usually designated by "π"). The interleaver 602 permutes the block of input bits to the second encoder. Although both of the constituent RSC encoders 501 are working on the same block of bits, they are in a different order. Thus, it is likely that when one encoder 501 produces a low-weight codeword, the other encoder 501 may produce a high-weight codeword. This combination of weak codes can, therefore, produce a powerful combined code.

The equations governing Turbo codes will now be discussed. A binary rate R=½ convolutional encoder has a constraint length K and memory M=K−1. The rate is calculated from the number of information bits transmitted divided by the total number of bits transmitted. The input to this encoder at time k is then the data bit $d_k$, and the corresponding codeword $C_k$ is the binary couple $(X_k, Y_k)$ where $$X_k = \sum_{i=0}^{k-1} g_{1i} d_{k-i} \text{ modulo } 2 g_{1i} = 0, 1 \quad (1)$$

$$Y_k = \sum_{i=0}^{k-1} g_{2i} d_{k-i} \text{ modulo } 2 g_{2i} = 0, 1 \quad (2)$$

where $G_1: \{g_{1i}\}$ and $G_2: \{g_{2i}\}$ are the two encoder generators.

In the case of the RSC code, however, the feedback loop needs to be taken into account. If the code is as in FIG. 6, the X output is the input data and the feedback feeds the Y output. Equations 3 and 4 result, which are modified from (1) and (2) above.

$$X_k = d_k \quad (3)$$

$$Y_k = \sum_{i=0}^{k-1} g_{2i} a_{k-i} \text{ mod. } 2$$

where $$a_k = d_k + \sum_{i=0}^{k-1} g_{1i} a_{k-i} \text{ mod. } 2 \quad (4)$$

A pseudo-random interleaver 602 may be used. Interleaver 602 with length N=2$^m$−1 can be produced by using a shift-register with feedback connections made according to a primitive polynomial of degree m. This is then loaded with a non-zero codeword, and cycled through all 2$^m$−1 different binary words. The resultant order can then be used to permute blocks of data bits.

Figure 7:
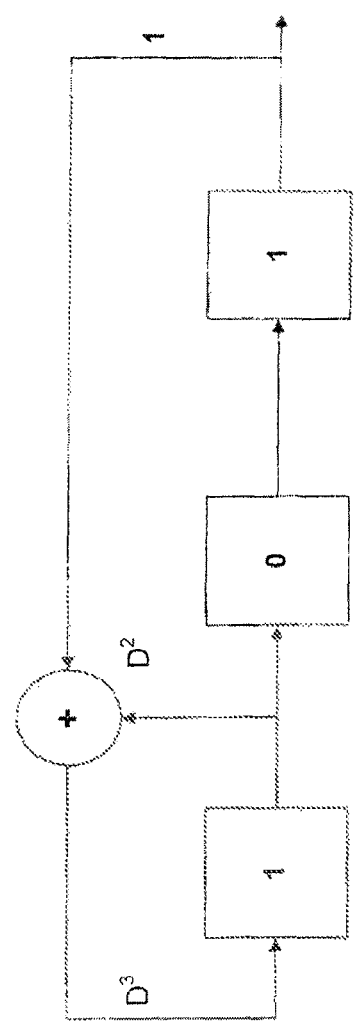
FIG. 7 shows a structure of a pseudo-random interleaver for a Turbo encoder.

For example, with a polynomial $D^3+D^2+1$, the structure of this pseudo-random generator is shown in FIG. 7, Starting with the codeword 101, we then have the result: 101, 010, 001, 100, 110, 111 & 011. The permutation [1234567]→[5214673] is obtained.

Figure 8:
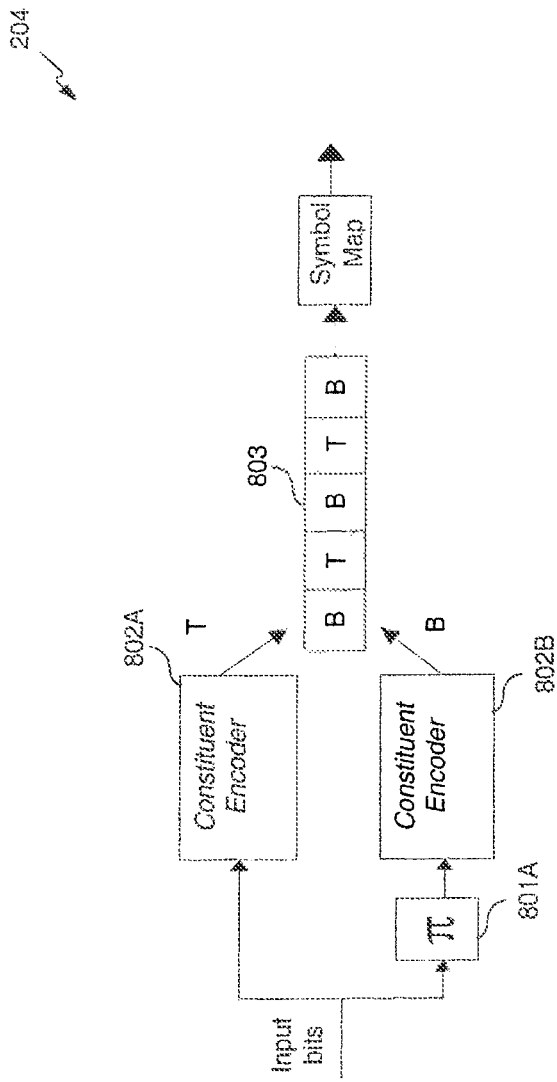
FIG. 8 shows an alternative structure of a Turbo encoder.

FIG. 8 shows an alternative structure of the Turbo Encoder 204. The input bits are fed into a constituent encoder 802A (discussed below with reference to FIG. 9), and, alternatively, to an interleaver 801 and then to an identical constituent encoder 802B. The letters T and B refer to "top" and "bottom" which are formed into a combined data stream 803. The data stream 803 is fed through a symbol mapper, which may be, e.g., a QAM constellation mapper (part of 205 in FIG. 2).

Figure 9:
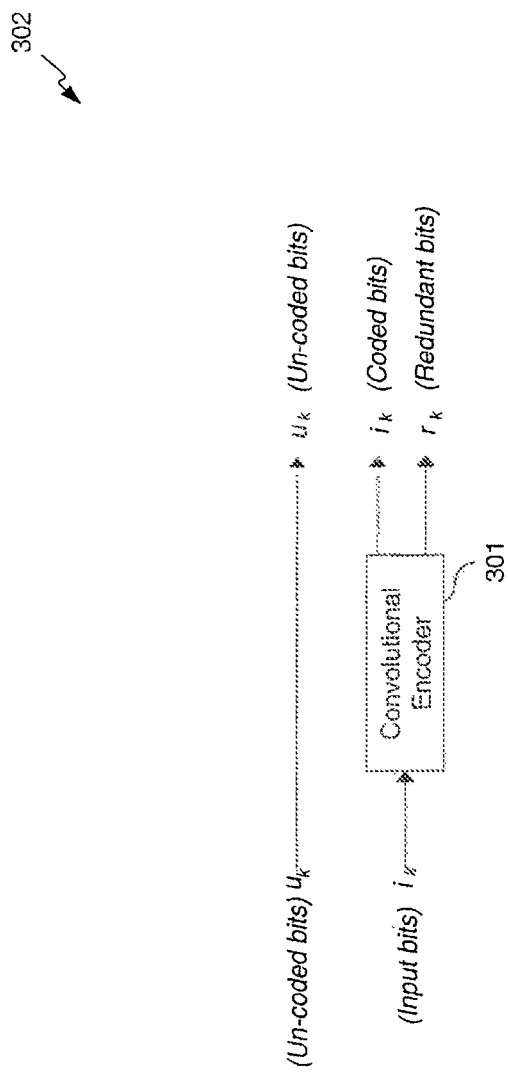
FIG. 9 illustrates an exemplary structure of a constituent encoder of FIG. 8.

FIG. 9 illustrates the structure of the constituent encoder 802 of FIG. 8. Some of the encoded bits $u_k$ remain uncoded, as shown in FIG. 9. Other encoded bits are fed into a convolutional encoder 301, as discussed above. The convolutional encoder 301 outputs coded bits $i_k$ and redundant bits $r_k$.

Figure 10:
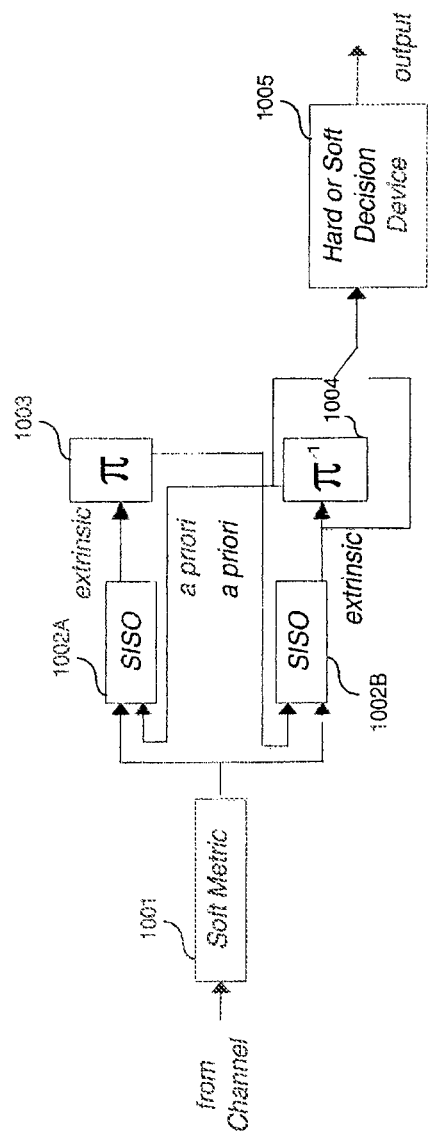
FIG. 10 illustrates a Turbo Decoder of FIG. 2.

FIG. 10 shows one implementation of a Turbo Decoder 208. Data comes in from the channel 108, and enters a soft decoder 1001, which outputs a soft decision of the input symbol. Two soft input, soft output (SISO) blocks 1002A, 1002B, are used to arrive at a better estimate of the received symbol through a number of iterations. The output of the SISO 1002A is fed into an interleaver 1003, and then to the SISO 1002B, the output of the SISO 1002B is fed to a deinterleaver 1004, and to a hard or soft decision block 1005. Similarly, the output of deinterleaver 1004 is fed back to the SISO 1002A, and optionally to the hard or soft decision block 1005. The hard or soft decision block 1005 can output either the best estimate of the symbol, or the probabilities and the weights obtained through the Turbo Decoder 208 to the subsequent processing logic.

Figure 11:
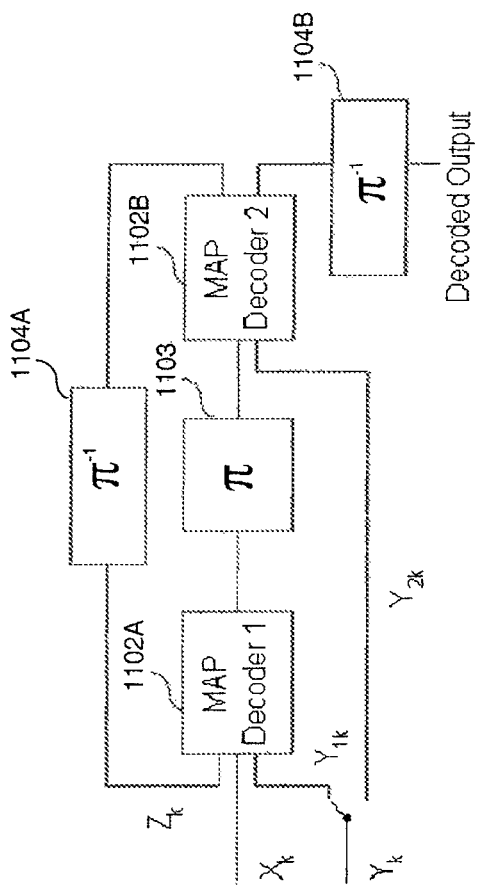
FIG. 11 illustrates an alternative structure of the Turbo Decoder of FIG. 2.

An alternative structure of the Turbo Decoder 208 is shown in FIG. 11. The Turbo Decoder 208 uses a soft-input/soft-output algorithm that makes a decision about the output based on weights. The highest weight codeword becomes the output word. The actual structure of the Turbo Decoder 208 is a serial concatenation of two identical elementary decoders 1102A, 1102B, separated by an interleaver 1103 and a de-interleaver 1104A. The decoder also has feedback between the two elementary decoders 1102A, 1102B. Decoded output passes through a de-interleaver 1104B. The Turbo Decoder 208 takes the form shown in FIG. 11.

The input of the Turbo Decoder 208 is the binary couple $(X_k, Y_k)$. The $Y_k$ is the combination of $Y_1 k$ and $Y_2 k$ from the Turbo Encoder 204 discussed above. The input is switched from the first decoder 1104A to the second decoder 1104B depending on the constituent encoder. When the input is switched to one decoder 1102, the input to the other decoder is set to zero. The decision is made after a set number of iterations. The number of iterations performed affects the BER.

The decision process made by the symbol-by-symbol MAP decoder 1102 may be based on the sign of the Log A Posteriori Probability (LAPP) ratio. The decision is made as follows: $u_k=+1$ if $P(u_k=+1|y) > P(u_k=-1|y)$, and $u_k=-1$ otherwise.

Each constituent decoder 1102 must have full knowledge of the trellis of the corresponding encoders. Input bits and parity bits for all possible state transitions must be known, and can be stored in an array or matrix. Also, the interleaver 1103 and de-interleavers 1104A, 1004B must be matched to the Turbo Encoder 204.

The iterative process will now be described. The two constituent decoders 1102 are initialized separately. Starting with decoder 1102A:

$$\alpha_0^{(1)}(s) = 1 \text{ for } s = 0$$
$$= 0 \text{ for } s \neq 0$$
$$\rho_N^{(1)}(s) = 1 \text{ for } s = 0$$
$$= 0 \text{ for } s \neq 0$$
$$L_{21}^e(u_k) = 0 \text{ for } k = 1, 2, \ldots, N$$

where $L(u_k)$ is the LAPP ratio. To set the initial state of the decoder 1102B we get the following:

$$\alpha_0^{(2)}(s) = 1 \text{ for } s = 0$$
$$= 0 \text{ for } s \neq 0$$

$\rho_N^{(2)}(s) = \alpha_N^{(2)}(s)$, $\forall s$. This is set in the first iteration $L_{12}^e(u_k)$ that is determined after the first half-iteration from decoder 1102A. The following explains the $n^{th}$ iteration. Again, the two decoders 1102A, 1102B are considered separately. For decoder 1102A, we have, for k=1, 2, ..., N get $y_k = (y_k^s, y_k^{1y})$, where is $y_k^s$ the source bit, and $y_k^{1y}$ is the parity bit from encoder 204.
compute $$\gamma_k(s', s) = \exp\left[\frac{1}{2} u_k \left( L_{21}^e(u_{Pinv[k]}) + \frac{4E_c}{N_0} y_k^s \right)\right] \cdot \exp\left[\frac{2E_c}{N_0} y_k^y x_k^y\right], \forall$$

state transitions allowed, where $u_k$ is set to the value of the encoder input that caused the transition s'→s; $L_{21}^e(u_{Pinv[k]})$
is the de-permuted extrinsic information from the previous decoder 1002B iteration, and $E_c$ is the energy per channel bit
compute $$\alpha_k^{(1)}(s) = \frac{\sum_{s'} \alpha_{k-1}^{(1)}(s') \cdot \gamma_k(s', s)}{\sum_s \sum_{s'} \alpha_{k-1}^{(1)}(s') \cdot \gamma_k(s', s)}, \forall s \quad (5)$$

for k=N, N-1, ..., 2
compute $$\hat{\rho}_k^{(1)}(s) = \frac{\sum_s \hat{\rho}_k^{(1)}(s) \cdot \gamma_k'(s', s)}{\sum_s \sum_{s'} \alpha_{k-1}^{(1)}(s') \cdot \gamma_k'(s', s)}, \forall s \quad (6)$$

for k=1, 2, ..., N
compute $$L_{12}^e(u_k) = \log\left(\frac{\sum_{s+} \alpha_{k-1}^{(1)}(s') \cdot \gamma_k^e(s', s) \cdot \hat{\rho}_k^{(1)}(s)}{\sum_{s-} \alpha_{k-1}^{(1)}(s') \cdot \gamma_k^e(s', s) \cdot \hat{\rho}_k^{(1)}(s)}\right) \quad (7)$$

For decoder 1102B, the iterative process is similar. For k=1, 2, ..., N
get $y_k = (y_{P[k]}^s, y_k^{2y})$
compute $$\gamma_k(s', s) = \exp\left[\frac{1}{2} u_k \left( L_{21}^e(u_{P[k]}) + \frac{4E_c}{N_0} y_{P[k]}^s \right)\right] \cdot \exp\left[\frac{2E_c}{N_0} y_{P[k]}^y x_k^y\right], \forall,$$

state transitions allowed, where $u_k$ is set to the value of the encoder input that caused the transition s'→s and $L_{12}^e(u_{P[k]})$ is the permuted extrinsic information from the previous decoder 1 iteration
compute $\alpha_k^{(2)}(s)$, $\alpha_{k-1}^{(2)}(s)$ and $L_{21}^e(u_k)$ from (5), (6) & (7).
Finally, after the last iteration, we must compute the decoded bits are computed by the following iteration:
for k=1, 2, ..., N
compute $$L_1(u_k) = \frac{4E_c}{N_0} \cdot y_k^s + L_{21}^e(u_{Pin[k]}) + L_{12}^e(u_k)$$

if $L_1(u_k) > 0$, decide $u_k = +1$
else decide $u_k = -1$.

Figure 12:
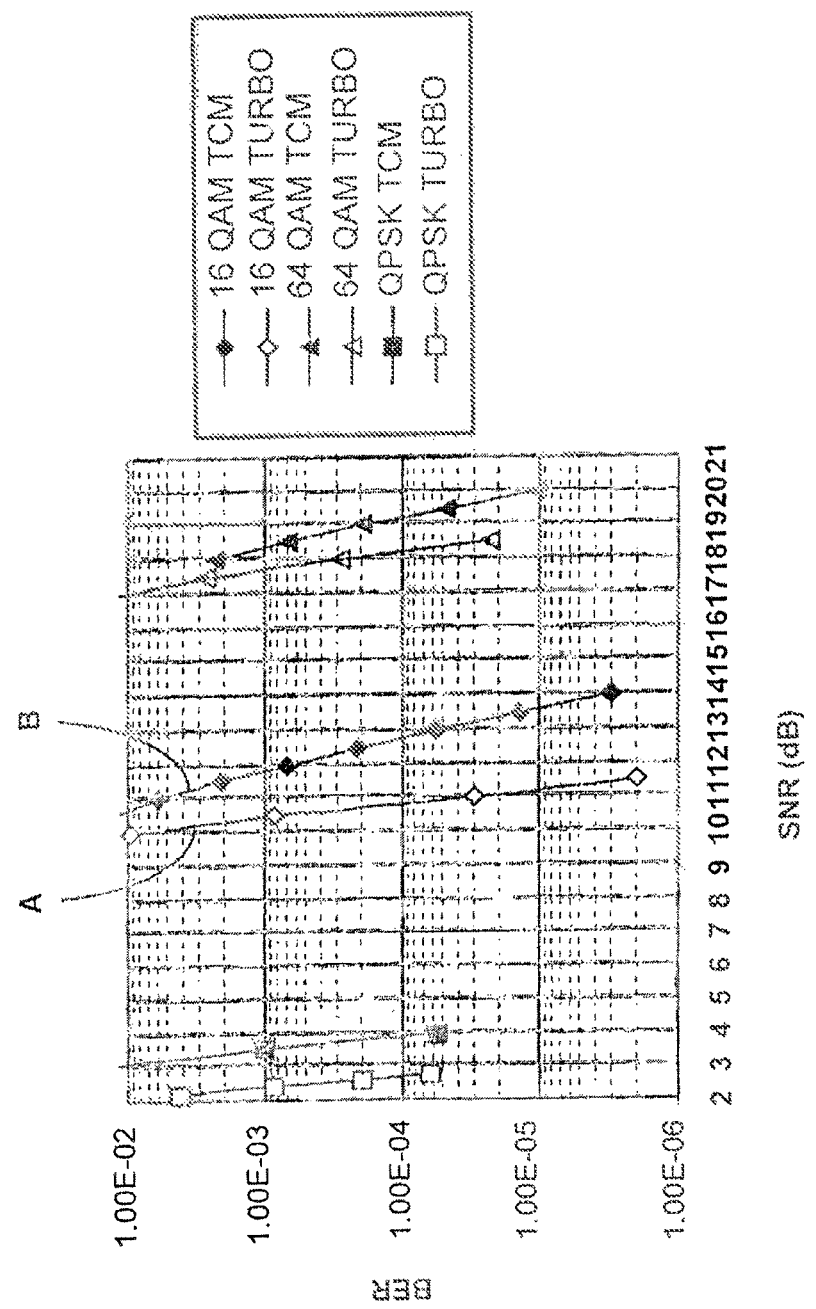
FIG. 12 illustrates the performance improvement due to the use of Turbo encoding in a cable modem system.

FIG. 12 shows the improvement in performance obtained using the present invention. As may be seen in FIG. 12, the improvement ranges from approximately to 1 dB to 2 dB. For example, consider the two center graphs, labeled A and B. If the required bit error rate is $10^{-4}$, and the physical channel (e.g., the actual coax cable connecting the transmitter and receiver) has a signal to noise ratio of 12 dB, it would be impossible to use a 16 QAM conventional trellis coded modulator (TCM) as shown in FIG. 12 (see graph B), because the signal to noise ratio of the channel is insufficient to effect the appropriate bit error rate. However, it is possible to use a 16 QAM modulation scheme with Turbo Encoding (see graph A), as discussed above. Thus, there is no need to go to a higher constellation QAM modulation scheme for this particular example of BER and SNR.

It will be appreciated that although in the example above, eight iterations are used to decode a symbol, more or fewer iterations may be used. It is expected that after approximately 16 iterations, further increases in the number of iterations will not be particularly useful. Generally, as the number of iterations in the Turbo Decoder 108 increases, the demands on the hardware also increase. However, when the lag time due to hardware issues is acceptable, it is expected that the optimal number of iterations will be somewhere between 8 and 16.

It will also be appreciated from looking at FIG. 12 that higher signal to noise ratio systems permit the use of higher QAM constellations, e.g., 256 QAM or 1024 QAM. However, it is believed that, since practical cable systems are limited to about 30 dB signal to noise ratio due to the inherent physical properties of the system, the highest QAM modulation scheme possible is 1024, or, more likely, 256 QAM.

It will be understood by those skilled in the art that various changes in form and details may be made therein without departing from the spirit and scope of the invention as defined in the appended claims. Thus, the breadth and scope of the present invention should not be limited by any of the above-described exemplary embodiments, but should be defined only in accordance with the following claims and their equivalents.

What is claimed is:

1. A method of encoding data for transmission over a channel comprising:
encoding the data using an outer, forward error correction (FEC) scheme to generate a first portion of outer encoded data and a second portion of outer encoded data;
encoding the first portion of outer encoded data using an inner encoding scheme to generate inner encoded data; and
mapping the second portion of outer encoded data and the inner encoded data to a modulation scheme to generate mapped data for transmission over the channel.

2. The method of claim 1, further including interleaving the first portion of outer encoded data before encoding the first portion of outer encoded data using the inner encoding scheme.

3. The method of claim 1, wherein the encoding the first portion of outer encoded data using the inner encoding scheme includes using a convolutional encoder.

4. The method of claim 1, wherein the encoding the first portion of outer encoded data using the inner encoding scheme includes interleaving the first portion of outer encoded data.

5. The method of claim 1, wherein the outer, FEC scheme is a block code or a trellis code.

6. The method of claim 1, wherein the inner encoding scheme uses an RSC (Recursive Systematic Convolutional) code or an NSC (Non-Systematic Convolutional) code.

7. The method of claim 1, wherein the inner encoding scheme: implemented using a first constituent encoder and a second constituent encoder, wherein the first portion of outer encoded data is fed into the first and second constituent encoders in an interleaved manner.

8. A system for encoding data for transmission over a channel comprising:
an outer, forward error correction (FEC) block configured to encode the data to generate a first portion of outer encoded data and a second portion of outer encoded data;
an inner encoder configured to encode the first portion of outer encoded data to generate inner encoded data; and
a modulator configured to map the second portion of outer encoded data and the inner encoded data to a modulation scheme to generate mapped data for transmission over the channel.

9. The system of claim 8, further including an interleaver configured to interleave the first portion of outer encoded data before the first portion of outer encoded data is encoded by the inner encoder.

10. The system of claim 8, wherein the inner encoder includes a convolutional encoder.

11. The system of claim 8, wherein the inner encoder includes an interleaver configured to receive the first portion of outer encoded data inputted into the inner encoder.

12. The system of claim 8, wherein the outer, FEC block uses a block code or a trellis code.

13. The system of claim 8, wherein the inner encoder uses an RSC (Recursive Systematic Convolutional) code or an NSC (Non-Systematic Convolutional) code.

14. The system of claim 8, wherein the inner encoder includes a first constituent encoder and a second constituent encoder, wherein the first portion of outer encoded data is fed into the first and second constituent encoders in an interleaved manner.

15. The system of claim 14, wherein the interleaved manner includes using a pseudo-random interleaver or a one-for-one interleaver.

16. A system for decoding data received over a channel comprising:
a demodulator configured to demodulate the received data to generate a first portion of demodulated data and a second portion of demodulated data;
an inner decoder configured to decode the first portion of demodulated data to generate inner decoded data;
an outer, forward error correction (FEC) decoder configured to decode the inner decoded data and the second portion of demodulated data.

17. The system of claim 16, wherein the inner decoder is configured to generate the inner decoded data as symbol estimates.

18. The system of claim 17, wherein the inner decoder is configured to provide the symbol estimates in probabilistic form to an external circuit.

19. The system of claim 16, wherein the inner decoder uses a soft input/soft output algorithm.

20. The system of claim 16, wherein the inner decoder is an iterative decoder.

* * * * *

UNITED STATES PATENT AND TRADEMARK OFFICE
CERTIFICATE OF CORRECTION

| | | |
|---|---|---|
| PATENT NO. | : 8,555,134 B2 | Page 1 of 1 |
| APPLICATION NO. | : 13/613328 | |
| DATED | : October 8, 2013 | |
| INVENTOR(S) | : Ravi Bhaskaran | |

It is certified that error appears in the above-identified patent and that said Letters Patent is hereby corrected as shown below:

In the Claims

Column 9, line 36, please replace "scheme: implemented" with --scheme is implemented--.

Signed and Sealed this
Tenth Day of December, 2013

Margaret A. Focarino
*Commissioner for Patents of the United States Patent and Trademark Office*